(12) United States Patent
Verspecht et al.

(10) Patent No.: US 11,268,997 B1
(45) Date of Patent: Mar. 8, 2022

(54) METHOD AND APPARATUS FOR CHARACTERIZING HOMODYNE TRANSMITTERS AND RECEIVERS

(71) Applicant: Keysight Technologies, Inc., Santa Rosa, CA (US)

(72) Inventors: Jan Verspecht, Santa Rosa, CA (US); Augustine Stav, Rohnert Park, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 11 days.

(21) Appl. No.: 16/996,561

(22) Filed: Aug. 18, 2020

(51) Int. Cl.
| | | |
|---|---|---|
| *G01L 21/32* | (2006.01) | |
| *G01R 23/20* | (2006.01) | |
| *H04L 27/38* | (2006.01) | |
| *G01R 27/28* | (2006.01) | |
| *G01R 35/00* | (2006.01) | |
| *H01J 41/04* | (2006.01) | |
| *H01J 41/06* | (2006.01) | |
| *H01J 41/16* | (2006.01) | |
| *H01J 41/14* | (2006.01) | |
| *G01L 21/00* | (2006.01) | |
| *G01L 21/34* | (2006.01) | |
| *G01L 19/08* | (2006.01) | |

(52) U.S. Cl.
CPC .............. *G01R 23/20* (2013.01); *G01R 27/28* (2013.01); *G01R 35/005* (2013.01); *H01J 41/04* (2013.01); *H01J 41/06* (2013.01); *H01J 41/14* (2013.01); *H01J 41/16* (2013.01); *H04L 27/3881* (2013.01); *G01L 19/083* (2013.01); *G01L 21/00* (2013.01); *G01L 21/32* (2013.01); *G01L 21/34* (2013.01)

(58) Field of Classification Search
CPC .. H01J 41/04; H01J 41/06; H01J 41/16; H01J 41/14; G01L 21/32; G01L 21/00; G01L 21/34; G01L 19/083; G01R 23/20; G01R 27/28; G01R 35/005; H04L 27/3881
USPC ......................................... 324/459, 460, 462
See application file for complete search history.

(56) References Cited

U.S. PATENT DOCUMENTS

| | | | |
|---|---|---|---|
| 8,711,905 B2 | 4/2014 | Kravitz | |
| 9,281,907 B2 | 3/2016 | An | |
| 2018/0048340 A1* | 2/2018 | Guyton | ..................... H04L 1/00 |
| 2018/0315439 A1* | 11/2018 | Madhu | ..................... G10L 25/18 |
| 2019/0064236 A1* | 2/2019 | Verspecht | ............ G01R 23/163 |

* cited by examiner

*Primary Examiner* — Raul J Rios Russo (57) ABSTRACT

A system of measuring and correcting for distortions in homodyne systems and a method for operating a data processing system to provide an estimate of distortions in homodyne systems are disclosed. The method for operating a data processing system to provide an estimate of a distortion introduced by a homodyne system when the homodyne system processes a time a multi-tone time domain input signal, x(t), to obtain a time domain output signal, y(t) includes receiving a frequency spectrum, X(f), of the multi-tone time domain input signal, x(t) and measuring an output frequency spectrum, Y(f), when the homodyne system operates on x(t). A plurality of parameters of a model that represents a linear frequency response of the homodyne system when operating on X(f) to arrive at Y(f) by fitting the model to Y(f) and X(f) is determined, and the model is applied to X(f) and Y(f) to estimate the distortions.

18 Claims, 6 Drawing Sheets

METHOD AND APPARATUS FOR CHARACTERIZING HOMODYNE TRANSMITTERS AND RECEIVERS

BACKGROUND

Wireless telecommunications technology relies on the use of band-limited high-frequency electro-magnetic (EM) signals. These signals can often be represented as the superposition of two amplitude modulated radio-frequency (RF) carrier signals, whereby both carrier signals have the same frequency but are shifted by 90 degrees with respect to one another. The amplitude modulation present on the first carrier signal is called the "in phase" signal or I-signal, and the amplitude modulation present on the second carrier signal is called the "quadrature" signal or Q-signal. The combination of the two signals is commonly referred to as the IQ-signal, which is mathematically represented by the complex function I(t)+j Q(t), with j representing the square root of −1. This type of modulation is called IQ-modulation.

Several techniques exist to generate and receive IQ-modulated carriers. The receivers and transmitters are never perfect, and there is a need to efficiently and accurately determine the amount of signal distortion present in such receivers and transmitters as well as the distortion that is present in their constituent parts. It would also be advantageous to use a knowledge of the distortions to adjust the input signal to compensate for the known distortions, and hence, improve the output signal from the transmitter or receiver.

One common architecture to realize such receivers and transmitters is the "direct conversion" architecture, also referred to as the "zero intermediate frequency" (zero-IF) or "homodyne" architecture. Some prior art schemes to estimate the IQ-imbalance of zero-IF receivers and transmitters rely on specific modulation schemes. Such schemes rely on a demodulation of the IQ-signal to characterize the IQ-imbalance. Errors can be present in the demodulation process, due to noise or nonlinear distortions, which results in errors in the IQ-imbalance characteristics. In addition, these methods cannot be used to characterize the distortion present in analog IQ-modulators or IQ-demodulators; they can only be used to characterize a complete transmitter or receiver system and not their constituent parts.

SUMMARY

The present disclosure includes a system of measuring and correcting for distortions in homodyne systems and a method for operating a data processing system to provide an estimate of distortions in homodyne systems.

The method for operating a data processing system to provide an estimate of a distortion introduced by a homodyne system when the homodyne system processes a time a multi-tone time domain input signal, x(t), to obtain a time domain output signal, y(t) includes receiving a frequency spectrum, X(f), of the multi-tone time domain input signal, x(t) and measuring an output frequency spectrum, Y(f), when the homodyne system operates on x(t). A plurality of parameters of a model that represents a linear frequency response of the homodyne system when operating on X(f) to arrive at Y(f) by fitting the model to Y(f) and X(f) is determined, and the model is applied to X(f) and Y(f) to estimate the distortions.

In one example, determining the plurality of parameters of the model includes fitting the model to first and second spline functions.

In another example, measuring the output frequency spectrum includes analyzing the output from the homodyne system with an instrument that provides an output spectrum from the homodyne system.

In another example, the instrument includes a vector network analyzer, oscilloscope, or vector signal analyzer.

In another example, the homodyne system includes a homodyne transmitter.

In another example, the homodyne system includes a homodyne receiver.

In another example, x(t) is periodic.

In another example, the method includes estimating a non-linear distortion as a function of frequency from the model.

In another example, the homodyne system includes an in-phase branch and a quadrature branch, and wherein the model includes a first function that models behavior only in the in-phase branch and a second function that models behavior only in quadrature branch.

In another example, each of the first and second functions includes a plurality of constants that are determined from X(f) and Y(f).

In another example, the homodyne system includes an in-phase branch and a quadrature branch, and wherein the model includes a first function that maps a balanced behavior of the homodyne system and a second function that maps an unbalanced behavior of the homodyne system.

A system that corrects for linear distortions in a homodyne system, the system includes a homodyne system that is characterized by linear distortions; and a data processing system that receives a time domain signal, x1(t), to be processed by the homodyne system, a modulation format that is to be applied to the x1(t), generates a frequency spectrum, X1(f) from the x1(t), and generates an ideal output spectrum, Y1(f), representing a frequency spectrum of an output signal that would be produced by the homodyne system in the absence of the linear distortions in the homodyne system. The data processing system stores a model of the homodyne system that maps Y1(f) to a frequency spectrum X2(f), computes an inverse Fourier transformation of X2(f) to arrive at a time domain signal, x2(t), and causes x2(t) to be input to the homodyne system.

In another example, the model includes an inverse of a mapping function that represents a linear behavior of the homodyne system when operating on X1(f) to arrive at an output signal having a frequency spectrum Y(f).

A system that measures distortions in a homodyne system that processes a multi-tone time domain signal, x(t) to generate an output signal, y(t), the system includes a first port that receives the x(t) and generates a frequency spectrum X(f) therefrom, a second port that receives the y(t) and generated a frequency spectrum Y(f) therefrom, and a data processing system that determines a plurality of parameters of a model that represents a linear frequency response of the homodyne system when operating on X(f) to arrive at Y(f) by fitting the model to Y(f) and X(f); and applies the model to X(f) and Y(f) to estimate the distortions.

In one example, the second port includes vector network analyzer, a vector signal analyzer, or an oscilloscope.

In another example, the data processing system is part of vector network analyzer, a vector signal analyzer, or an oscilloscope that outputs the distortions to a user.

BRIEF DESCRIPTION OF THE DRAWINGS

FIG. 6 illustrates a homodyne transmitter in which the I and Q channel responses are modeled in terms of functions $H_I$ and $H_Q$.

DETAILED DESCRIPTION

Figure 1:
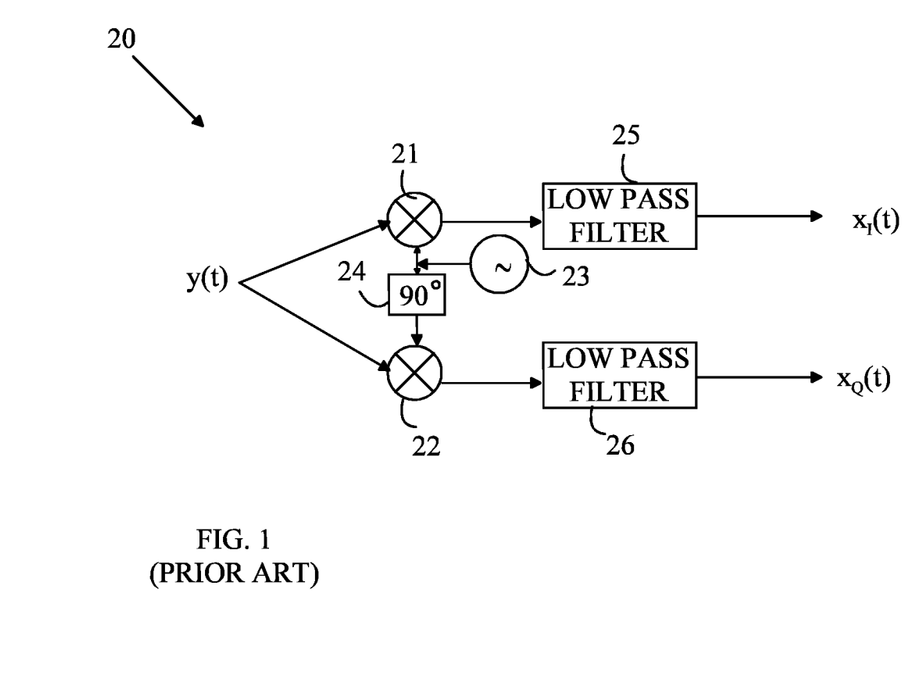
FIG. 1 illustrates a homodyne receiver.

As used in this disclosure, a homodyne system is defined to be a homodyne transmitter, homodyne receiver, or a homodyne transceiver. Refer now to FIG. 1, which illustrates a homodyne receiver. Receiver 20 receives a time domain input signal y(t). The input signal is down converted using mixers 21 and 22 that are driven by a local oscillator 23. The signal from local oscillator 23 is shifted 90° by phase shifter 24 before being applied to mixer 22. The outputs of the mixers are filtered through low-pass filters shown at 25 and 26 to recover the time domain signals $x_I(t)$ and $x_Q(t)$.

Figure 2:
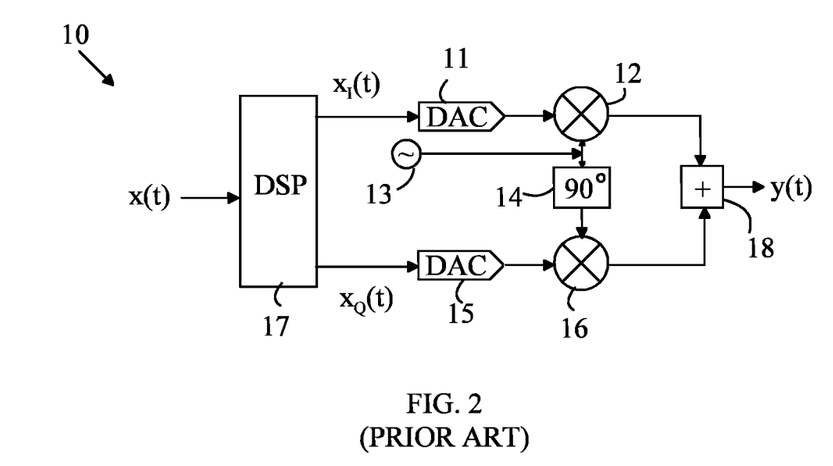
FIG. 2 illustrates a homodyne transmitter.

Refer now to FIG. 2, which illustrates a homodyne transmitter 10. The time domain baseband signal, x(t), is input to a digital signal processor (DSP) 17 which generates the in-phase and quadrature time domain signals, $x_I(t)$ and $x_Q(t)$. The digital I and Q signals are converted to analog signals by digital-to-analog converters (DAC) 11 and 15, respectively. The analog I and Q signals are then up converted by mixers 12 and 16 to a frequency determined by local oscillator (LO) 13. The phase of the local oscillator signal that is used to up convert the analog Q signal is shifted by 90° as shown at 14. The outputs of mixers 12 and 16 are then added by adder 18 to provide the modulated output signal, y(t).

In practice, homodyne systems deviate from the ideal systems shown in FIGS. 1 and 2. For example, the amplitude of $x_I(t)$ that is input to mixer 12 may be different than the amplitude of $x_Q(t)$ at input to mixer 16. In addition, the 90° phase shift introduced by phase shifter 14 may not be exactly 90°. Still further, there may be a time delay between $x_I(t)$ and $x_Q(t)$. These imperfections lead to distortions in the output signal y(t). Similar problems exist for homodyne receivers.

For any given homodyne system device, characterizing these distortions can aid in improving the design. In addition, it may be possible to correct for at least part of these distortions by "predistorting" the input signal in a manner such that subsequent distortions in the homodyne system result in a more ideal output signal.

As noted above, schemes for measuring the distortions that depend on a specific modulation scheme are known. Similarly, schemes that depend on single tone input signals can also be used. However, it would be advantageous to provide a distortion measurement system that utilizes a large number of tones and does not depend on a particular modulation scheme. For example, the distortions may change with a broad frequency spectrum in the input signals. In addition, it would be advantageous to measure the distortions as a function of frequency.

In one aspect of a distortion measurement system according to the present disclosure, the input IQ-signal x(t) and the output IQ-signal y(t) are processed in the frequency domain. As a result of the analysis the functions that describe the distortions as a function of frequency are determined. In addition, the inverse of these functions can be computed and used to pre-distort the input signal in a manner that will lead to a more ideal output signal.

For transmitters, x(t) is the digital input waveform and y(t) is the analog transmitter output signal, for receivers, x(t) is the analog input signal to the receiver and y(t) is the received digital waveform. For IQ-modulators, x(t) is equal to i(t)+j q(t), with i(t) and q(t) being the analog electrical input signals present at the I and Q input ports, respectively, and y(t) is the analog signal present at the output port. For IQ demodulators, x(t) is equal to the analog signal present at the input of the demodulator, and y(t) is equal to i(t)+j q(t), with i(t) and q(t) being the analog electrical output signals present at the I and Q input ports, respectively.

In the following discussion, X(f) and Y(f) represent the frequency spectra obtained by the Fourier transform of x(t) and y(t). In exemplary applications, the excitation signal x(t) is chosen such that it is statistically representative for a given modulation format. Examples of modulation formats are IEEE 802.11a/b/d/g for WiFi applications and 3GPP LTE and 5G NR for cellular applications. This implies that x(t) has a power spectral density and amplitude statistics that match the modulation format. In one aspect, the excitation signal is designed to be a periodical signal. Periodicity of x(t) enables coherent averaging, which results in a significantly increased dynamic range.

To simplify the following discussion, the case of a homodyne transmitter will be used. The system of the present disclosure assumes an input spectrum for the transmitter and measures the output spectrum of the transmitter for that input spectrum. The input and output spectra data are then used to construct two functions that represent the linear distortions introduced by the transmitter. The inverse of these functions can then be used to compute a pre-distortion spectrum that can be added to the input signal to provide a more ideal output signal.

In the case of a repetitive input signal, the tones will be equally spaced. However, the method of the present disclosure can also be utilized with multi-tonal signals in which the tones are not equally spaced. For each input tone, the output of the transmitter at a corresponding frequency is measured. The measured data is then used to determine the functions, $H_B(f)$ and $H_U(f)$ in the model:

$$Y(f)=H_B(f)X(f)+H_U(f)Z(f)+D(f)$$

where $$Z(f)=X^*(2f_{DC}-f). \quad (1)$$

Z(f) is the conjugated and inverted input spectrum and "f" is the frequency relative to carrier frequency, $f_{DC}$. $H_B(f)$ represents the balanced frequency response function and $H_U(f)$ represents the unbalanced response. $H_B(f)$ maps the input spectrum to the output spectrum in the case in which there is no unbalanced response or non-linear distortions. $H_U(f)$ maps the conjugated and inverted spectrum to the output spectrum when the I and Q paths are not identical. In the case in which the I and Q paths are identical, the unbalanced response is zero. D(f) represents the nonlinear distortion and noise.

In one aspect, the functions $H_U(f)$ and $H_B(f)$ depend on sets of parameters that are determined by fitting the measured values for Y(f) and X(f) such that the power spectral density of D(f) is minimized over the range of frequencies.

It should be noted that the measured values for Y(f) are determined using an instrument such as a vector network analyzer, a vector signal analyzer, or an oscilloscope. The spectrum X(f) is determined by the modulation signal x(t). Hence, there is a linear phase in the fitted values. The resulting functions detect the deviation from the linear phase. In one aspect of the invention, a constant group delay, τ, is determined across the bandwidth of the test frequencies. The manner in which τ is determined will be discussed in more detail below.

The form of the functions $H_B(f)$ and $H_U(f)$ will be discussed in more detail below. For the purpose of the present discussion, it will be assumed that $H_B(f)=H_{Bp}(f, p)$, where p is a vector of parameters that are determined by an optimization procedure. Similarly, $H_U(f)=H_{Uq}(f, q)$, where q is a vector of parameters that are determined by the optimization procedure. For example, the parameters can be determined by searching for the p and q values that minimize the error function, E(p,q), where $$E(p, q) = \sum_i |Y^N(f_j) - H_{Bp}(f_i, p)X(f_j) - H_{Uq}(f_i, q)Z(f_i)|^2 \quad (2)$$

The preferred functions for $H_{Uq}$ and $H_{Bp}$ will be discussed in more detail below. The summation is performed over all $f_i$ in the frequency band of interest. Here, $Y^N(f)=Y(f)\exp(-j2\pi f\tau)$. The delay, τ, reflects the fact that the spectrum Y(f) is measured at a different time from the spectrum for X(f). In principle, τ can be treated as another unknown parameter to be determined by minimizing E(p,q). However, as will be discussed in more detail below, the computation of τ requires a non-linear optimization, whereas, the dependence of $H_{Uq}$ and $H_{Bp}$ are linear in the components of p and q for many possible functional representations of $H_{Uq}$ and $H_{Bp}$. Hence, it is more computationally efficient to determine a good approximation to τ and then optimize the components of p and q.

Given the values of p and q that minimize E(p,q), the conventional measures of imbalance in a homodyne transmitter can be obtained from $$\varepsilon_A(f) = \frac{|A(f)| - 1}{|A(f)| + 1}$$

$$\varepsilon_\Theta(f) = \text{Arg}(A(f))/2$$

where $$A(f) = \frac{H_{Bp}(f, p_0) + H_{Uq}(f, q_0)}{H_{Bp}(f, p_0) - H_{Uq}(f, q_0)}$$

Figure 3:
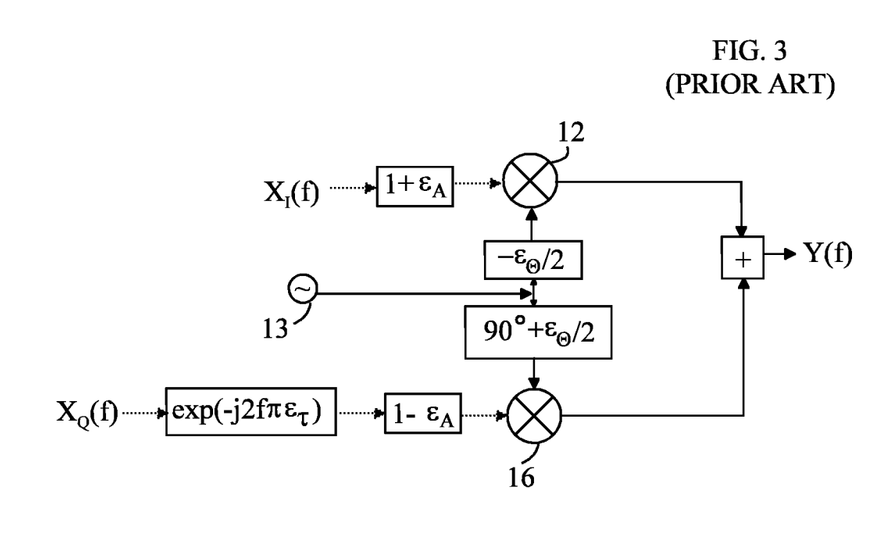
FIG. 3 illustrates the relationships of these conventional imbalance quantities to the components of a prior art homodyne transmitter.

Here, $p_o$ and $q_o$ are the values of p and q that minimize E(p,q). Refer now to FIG. 3, which illustrates the relationships of these conventional imbalance quantities to the components of a prior art homodyne transmitter. As can be seen from FIG. 3, åA measures the amplitude imbalance in the I and Q input channels, and εθ measures the error in the phase of the LO signal that is applied to the mixers. It should also be noted that the minimum value of E(p,q) is a measure of the non-linear distortion D(f).

As noted above, the Y spectrum is measured at a different time than the X spectrum. This group delay introduces a linear phase into the solution. Hence, the phase distortions represent the difference between a linear phase and the measured phase. In one aspect of the invention, the group delay, τ, is computed by finding the minimum of the distortion error-vector-magnitude, DEVM. DEVM is associated with an input and an output signal and is defined as the normalized root-mean-square error between the input and the output signals, whereby the output signal is matched to the input signal by a complex gain and a delay. The DEVM depends on the value of the group delay, t, and the gain that is applied to each of the components of X. DEVM is mathematically expressed as follows.

$$DEVM = \frac{\sum_{i=1}^{L} |X_i e^{-j2\pi(i-1)f_M \tau} - gY_i|^2}{\sum_{i=1}^{L} |X_i|^2}$$

In this model, the input spectrum, X, consists of L evenly spaced frequency components with an inter tone spacing of $f_m$. The output spectrum, Y, likewise consists of L evenly spaced tones with the same inter-tone spacing. The parameter, g, is a complex gain that is constant over the L frequency components.

A value for τ can then be obtained by finding the values of g and τ that produce the minimum DEVM. This model assumes a constant gain over the frequency band of interest; however, the model described above has a gain that varies as a function of frequency. In principle, the process can be iterated by using this value of τ to compute the functions $H_U$ and $H_B$ discussed above. Those values of $H_U$ and $H_B$ can then be used to compute a new value for τ using the above minimization formulation. However, it has been found that the value of τ obtained in this minimization process is sufficiently accurate to provide the measurements of the distortion using $H_U$ and $H_B$ without iteration.

The above-described embodiments utilize functional representations of the functions $H_U$ and $H_B$ in which each representation depends on a set of constant parameters that are determined to provide the best fit to the model shown in Eq. (1). In one exemplary embodiment, referred to as a spline function, the frequency axis containing the frequencies of interest is divided into a plurality of intervals. Within each interval, the functions are modeled as a linear combination of a plurality of base functions. The coefficients of the base functions in each interval are then determined by fitting the functional model to the measured values of Y subject to certain constraints at the boundaries of the frequency intervals.

The separation of the F-axis into intervals is performed by defining a plurality of points along the axis which delineate each interval. These points will be referred to as knots in the following discussion. The knots will be denoted by $v_i$, where i runs from 0 to K. The $i^{th}$ interval is the frequency range between $v_{i-1}$ and $v_i$.

To simplify the following discussion, this process will first be explained with respect to a single function F(f). The same base functions will be utilized in each interval; hence, it is convenient to define the base functions on a particular definition interval and adjust the locations within a particular interval to translate the interval of interest to the definition interval to evaluate the base function at the frequency of interest. Denote the base functions by $F_0(u)$, $F_1(u)$, ..., $F_p(u)$. The functions are defined on the interval [−1,1] in this example. Then, the value of the function for a frequency f in the $i^{th}$ interval is given by $$F(f) = \sum_{p=0}^{P} t_{p,i} F_p\left(2\frac{f - v_{i-1}}{v_i - v_{i-1}} - 1\right) \quad (3)$$

where $$v_{i-1} < f < v_i$$

Here, the coefficients $t_{p,i}$ are complex numbers to be determined in the fitting process.

As noted above, two functions are to be computed in the present disclosure, namely $H_U$ and $H_B$ discussed above. The complex coefficients for each of these functions will be different. In addition, the optimization is to be performed over the entire frequency band of interest. To distinguish the functions for $H_U$ and $H_B$ that are constructed using this piecewise approach, the functions will be denoted by $H_{SU}$ and $H_{SB}$. To simplify the discussion, the complex coefficients $t_{p,i}$ will be expanded into their real and imaginary parts as shown below. For the ith interval, i.e., $v_{i-1} \leq f \leq v_i$, $$H_{Usp}(f, \bar{a}, \bar{b}) = \sum_{p=0}^{P}(a_{i,p} + jb_{i,p})F_p\left(2\left(\frac{f - v_{i-1}}{v_i - v_{i-1}}\right) - 1\right)$$

$$H_{Bsp}(f, \bar{a}, \bar{b}) = \sum_{p=0}^{P}(c_{i,p} + jd_{i,p})F_p\left(2\left(\frac{f - v_{i-1}}{v_i - v_{i-1}}\right) - 1\right)$$

Here, the $a_{i,p}$ are the components of the vector a that are to be determined, and so on. As will become evident from the error function discussed below, $H_U$sp and $H_B$sp will be evaluated for frequencies $f_i$ corresponding to frequencies at which the spectrum Y is measured. For notational simplicity, a normalized frequency is defined by $$f_{i,k}^n = 2\left(\frac{f_{i,k} - v_{i-1}}{v_i - v_{i-1}}\right) - 1$$

Here, $f_{i,k}$ is the $k^{th}$ frequency at which Y is measured in the $i^{th}$ interval. Similarly, $Y_{i,k}$ will be defined to be the $i^{th}$ value of $Y^N$ ($f^n_{i,k}$), $X_{i,k}$ will be defined to be the $i^{th}$ value of X in the $k^{th}$ frequency interval, and $Z_{i,k}$ will be defined to be the $i^{th}$ value of Z in the $k^{th}$ frequency interval.

In one aspect of the invention, the unknown vectors a, b, c, and d are determined by finding the values of these vectors that minimize the least-squares-error function $$E(a_{i,p}, b_{i,p}, c_{i,p}, d_{i,p}) = \sum_{i=1}^{K+1}\sum_{k=1}^{N(k)}\left|Y_{i,j} - \sum_{p=0}^{P}(a_{i,p} + jb_{i,p})F_p(f^n_{i,k})X_{i,k} - \sum_{p=0}^{P}(c_{i,p} + jd_{i,p})F_p(f^n_{i,k})Z_{i,k}\right|^2$$

The minimization must be done subject to certain constraints. Consider the function $H_{Bsp}(f,a,b)$. The above-described procedure defines the function separately on each interval. However, the function is assumed to be continuous when transitioning from interval to interval. This places a constraint on the function at the knots. Similarly, it is advantageous to require that the first derivative of the function also be continuous at the knots, as algorithms that find the minimum of E utilize systems of equations that involve the derivatives of the functions. In general, these constraints lead to a set of linear equations that must be satisfied at the knots. The requirement that the derivatives of order d be continuous at the knots leads to the set of equations:

$$\sum_{p=0}^{P}\frac{\alpha_{i,p}F_p^{(d')}(1)}{(v_i - v_{i-1})^{d'}} = \sum_{p=0}^{P}\frac{\alpha_{i+1,p}F_p^{(d')}(-1)}{(v_{i+1} - v_i)^{d'}}$$

where there is one such equation for each $\alpha$ in (a,b,c,d), d' in (0, 1, . . . ,D) and i in (1, 2, . . . , K). In practice, D=2 is sufficient for the above-described embodiments.

The minimization with constraints can be performed by using the method of Lagrange multipliers. Since such calculations are known to the numerical analysis arts, they will not be discussed in detail here. It is sufficient to note that the method leads to a set of linear equations in the components of the vectors a, b, c, and d and require that the derivatives D be at least 2.

In the above-described embodiments, the knots are predefined. However, embodiments in which the knots are determined by the quality of the fit can also be utilized. In one exemplary embodiment, the Legendre polynomials are used as base functions.

The algorithm starts by performing a fit using only the minimum and maximum frequency values as knots. Under these conditions there are no continuity constraints and the fitting procedure behaves like a simple polynomial regression algorithm. Next, the residual error of the fit is evaluated. In case the error is larger than a predefined tolerance, a new knot is added. The new knot is chosen as the median of the F-values. A new fit is performed, and a new residual error is calculated. In case the error is larger than the predefined tolerance, a new knot is added to the interval where the largest error occurs. The new knot is chosen as the median of the frequency values belonging to the interval with the largest error. This procedure is repeated, each time splitting the intervals with the largest error in two by adding a knot, until the maximum error becomes smaller than the tolerance.

In practical cases the data may contain high frequency noise on the X and Y-values with a small but still significant probability of having a relatively high amplitude. Such data points are usually referred to as "outliers." Such outliers cause the algorithm to add too many knots near the location of the outlier. This issue is significantly improved by calculating the residual error between the fit and a moving average of the X-values and the Y-values. Even a simple moving average of three values makes a significant difference.

The above-described embodiments are directed to a homodyne transmitter. However a similar analysis can be utilized to determine the distortions in a homodyne receiver. A common analysis can be utilized if the notation used above is redefined. For the purposes of this discussion, X(f) will be the complex frequency spectrum of the input of the homodyne receiver and Y(f) will be the complex frequency spectrum of the output of the homodyne receiver. With this notation, it can be shown that Eq. (1) discussed above also applies to a homodyne receiver.

The above embodiments allow one to measure the distortions introduced by a homodyne system. In principle, one can apply an input signal having a known spectrum to the homodyne system and measure the frequency spectrum of the output of the homodyne system with a test instrument such as a vector network analyzer. The two spectra can then be used to define the unknown parameters in a model of the system responses as described above. Given the model, the distortions can be computed as a function of frequency. The present analysis allows the distortions to be measured using multi-tonal input signals, and does not require a knowledge of the modulation scheme.

Figure 4:
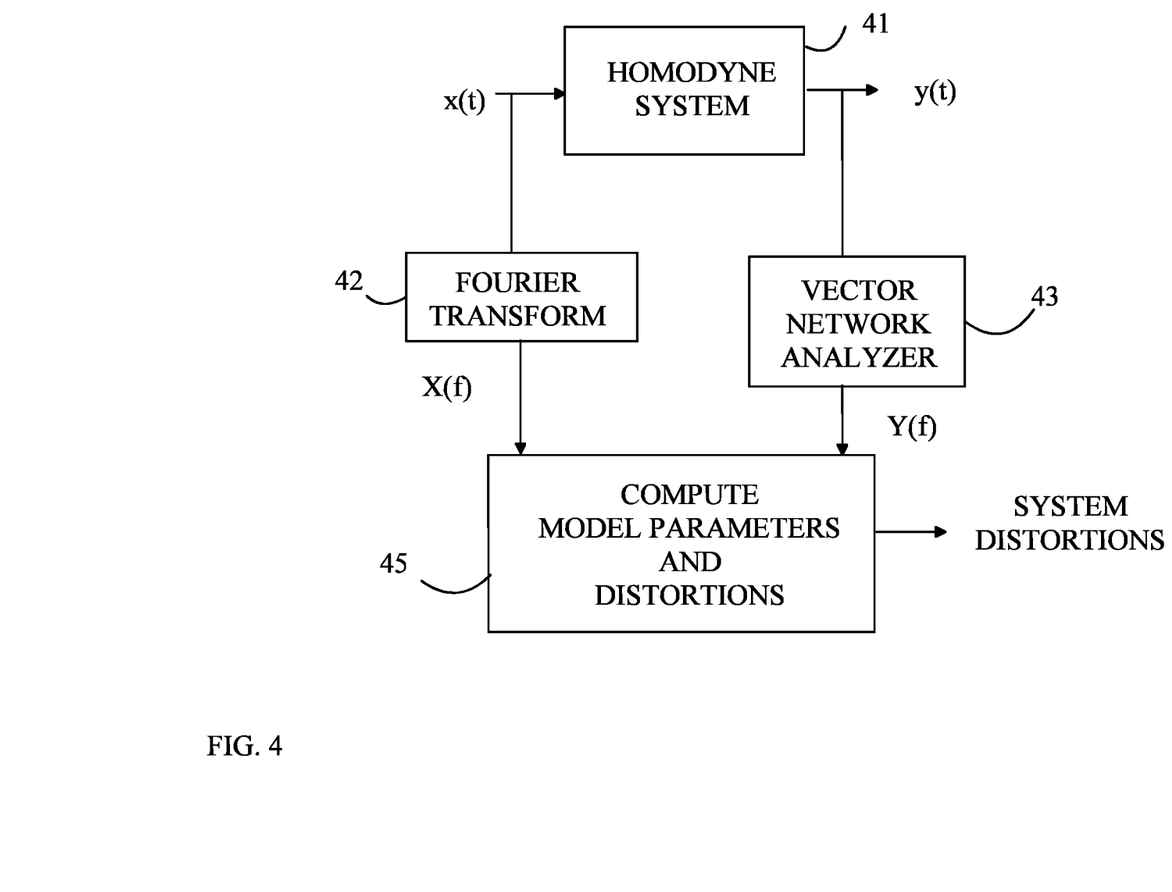
FIG. 4 illustrates a measurement system according to one embodiment of a system according to the present disclosure.

Refer now to FIG. 4, which illustrates a measurement system according to one embodiment of a system according to the present disclosure. A known multi-tonal input signal x(t) is input to homodyne system 41, which could be either a transmitter or receiver. The output of homodyne system 41, y(t) is analyzed in a vector network analyzer 43 to provide the frequency spectrum Y(f) of signal y(t). The frequency spectrum of input signal x(t) is generated by Fourier transform generator 42, which may utilize separate hardware or be part of data processing system 45. Data processing system 45 computes the model parameters for the functions characterizing homodyne system 41 by fitting X(f) and Y(f) to model functions having unknown parameters that are determined to minimize an error function in a manner analogous to that discussed above. The model functions are then used to provide estimates of the distortions introduced by homodyne system 41. While the measured distortions provide information about the non-ideal characteristics of homodyne system 41, the distortions do not correct for the errors introduced into y(t) as a result of these distortions.

Figure 5:
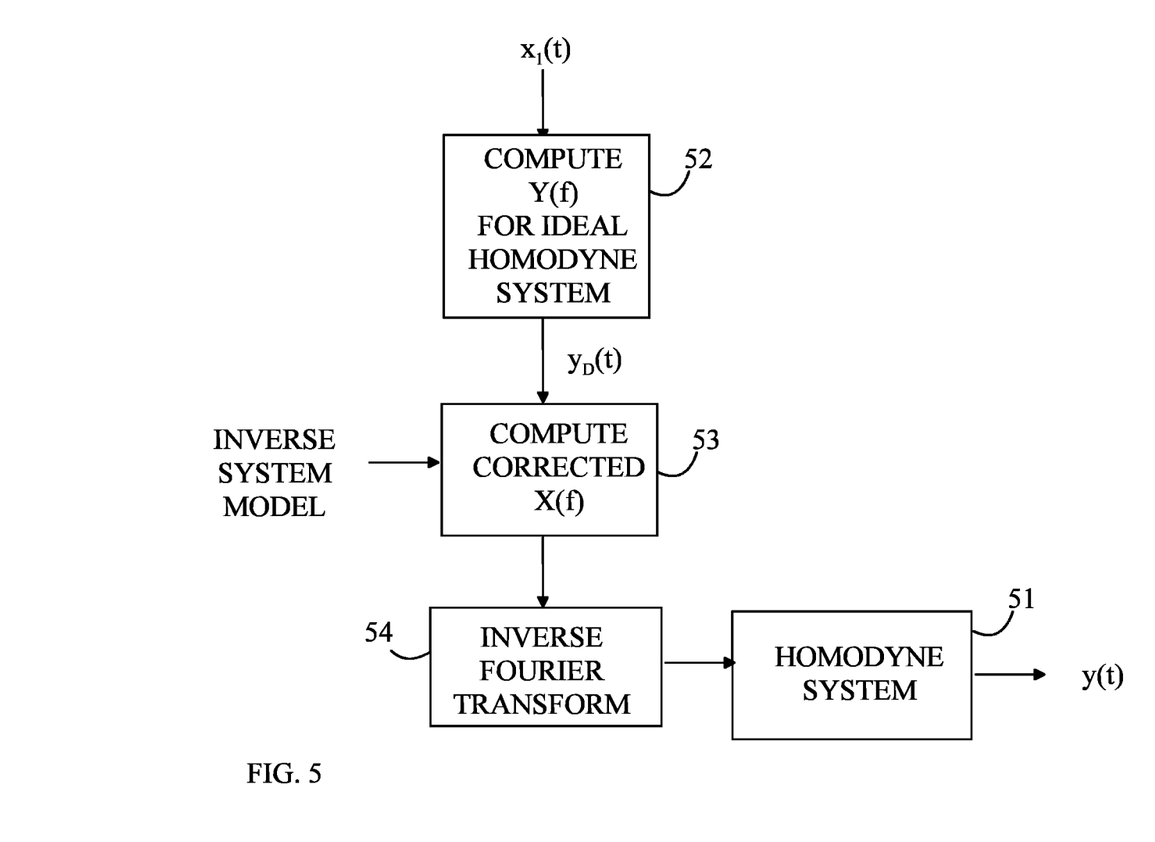
FIG. 5 illustrates a system for pre-distorting an input signal to compensate for the linear distortions introduced by a non-ideal homodyne system.

Refer now to FIG. 5, which illustrates a system for pre-distorting an input signal to compensate for the linear distortions introduced by a non-ideal homodyne system. To simplify the following discussion, it will be assumed that homodyne system 51 is a transmitter. Homodyne system 51 is to be used to up-convert a signal x(t) using a LO that is part of homodyne system 51. The output of homodyne transmitter is denoted by y(t). Assuming that the transmitter is ideal, the desired output signal, $y_D(t)$, can be computed from a knowledge of the LO and the modulation format. Given the desired output signal from homodyne system 51, and assuming that the distortions introduced by the real homodyne system are linear, this aspect of the invention determines the input signal that will provide that ideal output as shown at 52.

The procedure requires that the functions that characterize the imperfect homodyne transmitter in the frequency range of interest be determined. For example, the functions $H_B$ and $H_U$ can be determined by uploading a known signal x(t) to the homodyne transmitter and determining the frequency spectrum of the output signal Y(f) as discussed above. Once the free parameters in the functions $H_B$ and $H_U$ have been determined, the inverses of the functions $H_B$ and $H_U$ can be computed as described below. The inverses map an output signal to an input signal that will produce that output as shown at 53. Hence, if one uses the ideal output signal in the inverse model, the frequency spectrum of the input signal that produces that output signal can be determined. The inverse Fourier transform of the determined input signal spectrum is then used as input to the transmitter in place of the original input signal as shown at 54.

For a homodyne system that lacks significant non-linear distortions, the frequency spectrum of the output of the transmitter is related to the frequency spectrum of the input to the transmitter by $$Y(f)=H_B(f)X(f)+H_U(f)X^*(-f), \quad (3)$$

where Y(f) is the Fourier transform of y(t), X(f) is the Fourier transform of $x(t)=x_1(t)+jx_Q(t)$, $H_B(f)$ is the balanced frequency response function, $H_U(f)$ is the unbalanced frequency response function, and "*" stands for complex conjugate.

First, the functions $H_B$ and $H_U$ must be determined by inputting a known test signal having a spectrum $X_T(f)$ to the transmitter and measuring the frequency spectrum, $Y_T(f)$ generated by the transmitter. $H_B$ and $H_U$ can be determined by fitting the $X_T(f)$ and the resulting $Y_T(f)$ using an error minimization procedure. For example, as noted, the functions $H_B$ and $H_U$ can be expanded as a spline fit that depends on a number of parameters that can be determined by least squares minimization of an error function.

Next, the determined functional representations of $H_B$ and $H_U$ are used to calculate an inverse model of the transmitter.

$$X(f) = H_{INVB}(f)Y(f) - H_{INVU}(f)Y^*(-f),$$

where $$H_{INVB}(f) = \frac{H_B^*(-f)}{H_B^*(-f)H_B(f) - H_U(f)H_U^*(-f)}$$

and $$H_{INVU}(f) = \frac{-H_U(f)}{H_B^*(-f)H_B(f) - H_U(f)H_U^*(-f)}$$

The inverse model provides a mechanism for "pre-distorting" an input signal prior to transmission such that the resultant output signal has reduced linear distortions. Given an input signal $x_1(t)$, and a knowledge of the modulation scheme implemented by the transmitter, an "ideal" output signal, $y_D(t)$, having a spectrum $Y_1(f)$ can be generated. The inverse model is then used to compute the spectrum of a new input signal having a spectrum $X_2(f)$ and a new time domain signal, $x_2(t)$, by an inverse Fourier transform of $X_2(f)$. The time domain signal is then input to the transmitter in place of the original time domain signal $x_1(t)$.

As noted above, Eq. (3) also describes a homodyne receiver in which X(f) is the complex frequency spectrum of the input to the homodyne receiver and Y(f) is the complex frequency spectrum of the output of the homodyne receiver. The functions $H_U$ and $H_B$ are determined by fitting the measured output spectrum $Y_1(f)$ to the known spectrum $X_1(f)$ for a calibration data set for which $X_1(f)$ is known and $Y_1(f)$ is measured when $X_1(f)$ is input to the receiver. The resulting $H_B$ and $H_U$ are then used to generate the inverse functions. The inverse model is then used to compute the spectrum of a new input signal $X_2(f)$ and a new time domain signal, $x_2(t)$, by an inverse Fourier transform of $X_2(f)$. The new time domain signal is then input to the transmitter in place of the original time domain signal $x_1(t)$.

The above-described embodiments utilize a particular pair of functions, $H_B$ and $H_U$ to model the linear behavior of a homodyne system. However, other linear models could also be utilized. For example, an embodiment could utilize functions that model the I and Q channel behaviors. Refer to FIG. 6, which illustrates a homodyne transmitter in which the I and Q channel responses are modeled in terms of functions $H_I$ and $H_Q$. The function $H_I$ models the behavior in the I-path independent of the function, $H_Q$, which models the behavior of the homodyne system in the Q-path. In this case, $$Y(f)=H_I(f)X_I(f)+jH_Q(f)X_Q(f). \quad (4)$$

Here, an input signal x(t) has been split into I and Q components having frequency spectra $X_1(f)$ and $X_Q(f)$, respectively. This system model describes common homodyne errors like IQ gain imbalance, LO quadrature phase error, and RF dispersion. The functions $H_I$ and $H_Q$ can be represented in terms of unknown parameters that are determined to minimize an error function of the form $E=|Y(f)-H_I(f)X_I(f)+jH_Q(f)X_Q(f)|^2$, in a manner analogous to that described above for a set of calibration data. The functions $H_B$ and $H_U$ can be computed from the functions $H_I$ and $H_Q$. For example, it can be shown that $$\begin{bmatrix} H_B(f) \\ H_U(f) \end{bmatrix} = \frac{1}{2} \begin{bmatrix} 1 & 1 \\ 1 & -1 \end{bmatrix} \begin{bmatrix} H_I(f) \\ H_Q(f) \end{bmatrix}$$

The IQ model shown in Eq. (4) is useful in relating the conventional distortion parameters shown in FIG. 3 to the model functions $H_I(f)$ and $H_Q(f)$ and obtaining values of the conventional distortion parameters as a function of frequency. Referring again to FIG. 3, $$Y(f) = (1+\varepsilon_A)e^{-j\varepsilon\theta/2}X_I(f) + (1-\varepsilon_A)e^{j\varepsilon\theta/2}e^{-j2\pi f\varepsilon_r}jX_Q(f) \quad (5)$$

By comparing FIGS. 3 and 6, $$H_I(f) = (1+\varepsilon_A)e^{-j\varepsilon\theta/2}$$

and $$H_Q(f) = (1-\varepsilon_A)e^{j\varepsilon\theta/2}e^{-j2\pi f\varepsilon_r}$$

The classic homodyne system parameters can be computed from the functions $H_I(f)$ and $H_Q(f)$. To simplify the formulation, define $R(f) = H_I(f)/H_Q(f)$. Then, the classic homodyne system parameters as a function of frequency are given by:

$$\varepsilon_A(f) = \frac{|R(f)| - 1}{|R(f)| + 1}$$

$$\varepsilon_\theta(f) = -\varphi(R(f))$$

$$E_\tau(f) = \frac{d\varphi(R(f))}{df}$$

Here, $\varphi(R(f))$ is the phase of $R(f)$. The classic parameters are defined for $f=0$.

As noted above, the parameters that define the functions $H_B(f)$ and $H_U(f)$ are determined by assuming that the non-linear distortions are small, and hence, $D(f)$ is set to zero during the fitting process. An estimate of $D(f)$ can be obtained from the calibration data from Eq. (1) from the difference between the fitted values and the observed output of the homodyne system, i.e., $$Y(f) - H_B(f)X(f) + H_U(f)Z(f) = D(f)$$

Some of the above examples have utilized periodic input functions for $x(t)$, which result in the input spectrum being multi-tonal. However, the above models and method are also valid for non-periodic input signals.

The above-described embodiments have been provided to illustrate various aspects of a system and method according to the present disclosure. However, it is to be understood that different aspects of the present disclosure that are shown in different specific embodiments can be combined to provide other embodiments a system and method according to the present disclosure. In addition, various modifications will become apparent from the foregoing description and accompanying drawings. Accordingly, the present invention is to be limited solely by the scope of the following claims.

What is claimed is:

1. A method for operating a data processing system to provide an estimate of a distortion introduced by a homodyne system when said homodyne system processes a multi-tone time domain input signal, $x(t)$, to obtain a time domain output signal, $y(t)$, said method comprising:

receiving a frequency spectrum, $X(f)$, of said multi-tone time domain input signal, $x(t)$;
measuring an output frequency spectrum, $Y(f)$, when said homodyne system operates on $x(t)$;
determining a plurality of parameters of a model that represents a linear frequency response of said homodyne system when operating on $X(f)$ to arrive at $Y(f)$ by fitting said model to $Y(f)$ and $X(f)$; and
applying said model to $X(f)$ and $Y(f)$ to estimate said distortions.

2. The method of claim 1 wherein determining said plurality of parameters of said model comprises fitting said model to first and second spline functions.

3. The method of claim 1 wherein measuring said output frequency spectrum comprises analyzing said output from said homodyne system with an instrument that provides an output spectrum from said homodyne system.

4. The method of claim 3 wherein said instrument comprises a vector network analyzer.

5. The method of claim 3 wherein said instrument comprises an oscilloscope.

6. The method of claim 3 wherein said instrument comprises a vector signal analyzer.

7. The method of claim 1 wherein said homodyne system comprises a homodyne transmitter.

8. The method of claim 1 wherein said homodyne system comprises a homodyne receiver.

9. The method of claim 1 wherein said $x(t)$ is periodic.

10. The method of claim 1 further comprising estimating a non-linear distortion as a function of frequency from said model.

11. The method of claim 1 wherein said homodyne system comprises an in-phase branch and a quadrature branch, and wherein said model comprises a first function that models behavior only in said in-phase branch and a second function that models behavior only in quadrature branch.

12. The method of claim 11 wherein each of said first and second functions comprises a plurality of constants that are determined from $X(f)$ and $Y(f)$.

13. The method of claim 1 wherein said homodyne system comprises an in-phase branch and a quadrature branch, and wherein said model comprises a first function that maps a balanced behavior of said homodyne system and a second function that maps an unbalanced behavior of said homodyne system.

14. A system that corrects for linear distortions in a homodyne system, said system comprising:

a homodyne system that is characterized by linear distortions; and
a data processing system that receives a time domain signal, $x1(t)$, to be processed by said homodyne system, a modulation format that is to be applied to said $x1(t)$, generates a frequency spectrum, $X1(f)$ from said $x1(t)$, and generates an ideal output spectrum, $Y1(f)$, representing a frequency spectrum of an output signal that would be produced by said homodyne system in the absence of said linear distortions in said homodyne system, wherein
said data processing system stores a model of said homodyne system that maps $Y1(f)$ to a frequency spectrum $X2(f)$, computes an inverse Fourier transformation of $X2(f)$ to arrive at a time domain signal, $x2(t)$, and causes $x2(t)$ to be input to said homodyne system.

15. The system of claim 14 wherein said model comprises an inverse of a mapping function that represents a linear behavior of said homodyne system when operating on X1(f) to arrive at an output signal having a frequency spectrum Y(f).

16. A system that measures distortions in a homodyne system that processes a multi-tone time domain signal, x(t) to generate an output signal, y(t), said system comprising:
a first port that receives said x(t) and generates a frequency spectrum X(f) therefrom;
a second port that receives said y(t) and generates a frequency spectrum Y(f) therefrom;
a data processing system that determines a plurality of parameters of a model that represents a linear frequency response of said homodyne system when operating on X(f) to arrive at Y(f) by fitting said model to Y(f) and X(f); and
applies said model to X(f) and Y(f) to estimate said distortions.

17. The system of claim 16 wherein said second port comprises a vector network analyzer, a vector signal analyzer, or an oscilloscope.

18. The system of claim 16 wherein said data processing system is part of a vector network analyzer, a vector signal analyzer, or an oscilloscope that outputs said distortions to a user.

* * * * *

UNITED STATES PATENT AND TRADEMARK OFFICE
CERTIFICATE OF CORRECTION

| | | |
|---|---|---|
| PATENT NO. | : 11,268,997 B1 | Page 1 of 1 |
| APPLICATION NO. | : 16/996561 | |
| DATED | : March 8, 2022 | |
| INVENTOR(S) | : Jan Verspecht and Augustine Stav | |

It is certified that error appears in the above-identified patent and that said Letters Patent is hereby corrected as shown below:

On the Title Page

Column 2, under item (56) References Cited, after "U.S. PATENT DOCUMENTS", Line 7, insert
--OTHER PUBLICATIONS
CHUNG, et al., 10 Imbalance Compensation and Digital Predistortion for Millimeter-Wave Transmitters Using Reduced Sampling Rate Observations, IEEE Transactions on Microwave Theory and Techniques, Vol. 66, No 7, July 2018
ZHU, et al., Joint 110 Mismatch and Distortion Compensation in Direct Conversion Transmitters, IEEE Transactions on Wireless Communications, Vol. 12, No.6, June 2013
DWIYASA, et al., Algorithm and Hardware Architecture of High Accuracy 10 Imbalance Estimation and Compensation for OFDM System, 2012 IEEE International Symposium on Intelligent Signal Processing and Communication Systems, ISPACD 2012, November 4-7,2012--

Column 2, under item (57) Abstract, Line 7, after "processes" delete "a time"

Signed and Sealed this
Fifth Day of July, 2022

Katherine Kelly Vidal
*Director of the United States Patent and Trademark Office*